United States Patent [19]
Fujii et al.

[11] Patent Number: 5,721,507
[45] Date of Patent: Feb. 24, 1998

[54] FULL-WAVE RECTIFYING CIRCUIT HAVING ONLY ONE DIFFERENTIAL PAIR CIRCUIT WITH A FUNCTION FOR COMBINING A PAIR OF HALF-WAVE RECTIFIED CURRENTS INTO A FULL-WAVE RECTIFIED CURRENT

[75] Inventors: Tomohiro Fujii, Tokyo; Hiroshi Kudou, Kanagawa, both of Japan

[73] Assignee: NEC Corporation, Tokyo, Japan

[21] Appl. No.: 645,833

[22] Filed: May 14, 1996

[30] Foreign Application Priority Data

May 22, 1995 [JP] Japan ........................ 7-122173

[51] Int. Cl.$^6$ ........................................ H02M 7/217
[52] U.S. Cl. .......................... 327/354; 327/62; 327/303; 327/65; 327/77
[58] Field of Search ........................ 327/354, 62, 303, 327/65, 77

[56] References Cited

U.S. PATENT DOCUMENTS

| | | | |
|---|---|---|---|
| 3,584,234 | 6/1971 | Fredricsson | 327/303 |
| 4,038,684 | 7/1977 | Miyamoto | 348/647 |
| 5,477,171 | 12/1995 | Menegoli et al. | 327/87 |

FOREIGN PATENT DOCUMENTS

| | | |
|---|---|---|
| 63-58484 | 11/1988 | Japan. |
| 3-2676 | 1/1991 | Japan. |
| 1 478 642 | 7/1977 | United Kingdom. |

*Primary Examiner*—David C. Nelms
*Assistant Examiner*—Andrew Q. Tran
*Attorney, Agent, or Firm*—Young & Thompson

[57] ABSTRACT

In a full-wave rectifying circuit comprising a differential amplifier (20) differentially amplifies an input alternating current signal ($V_{IN}$) to produce first and second amplified output voltages ($V_{O1}$, $V_{O2}$) and a voltage reference circuit (30) for generating a reference voltage ($V_{REF}$), a differential pair circuit (40) carries out half-wave rectification on the first and the second amplified output voltages on the basis of the reference voltage to obtain first and second half-wave rectified currents ($I_{C3}$, $I_{C4}$). The differential pair circuit (40) includes a combining part (44) for combining the first and the second half-wave rectified currents into a full-wave rectified current ($I_{RO}$). The full-wave rectifying circuit may further comprise a current/voltage converting section (50) for converting the full-wave rectified current into a full-wave rectified voltage ($V_{RO}$).

9 Claims, 6 Drawing Sheets

FULL-WAVE RECTIFYING CIRCUIT HAVING ONLY ONE DIFFERENTIAL PAIR CIRCUIT WITH A FUNCTION FOR COMBINING A PAIR OF HALF-WAVE RECTIFIED CURRENTS INTO A FULL-WAVE RECTIFIED CURRENT

BACKGROUND OF THE INVENTION

This invention relates to a full-wave rectifying circuit and, more particularly, to a full-wave rectifying circuit for use in a semiconductor integrated circuit.

As is well known in the art, such a full-wave rectifying circuit full-wave rectifies an input alternating current signal such as a sinusoidal wave signal into a full-wave rectified signal.

In the manner which will later be described, a conventional full-wave rectifying circuit has first and second power supply terminals supplied with first and second source potentials, respectively. The first power source potential is higher than the second power source potential. The first power source potential may be a positive source voltage while the second power source potential may be a zero voltage. The full-wave rectifying circuit comprises a differential amplifier, a voltage reference circuit, and first and second differential pair circuits. The differential amplifier has first and second amplifier input terminals supplied with the input alternating current signal therebetween. The differential amplifier differentially amplifies the input alternating current signal. The differential amplifier has first and second amplifier output terminal for producing first and second amplified output voltages, respectively. The voltage reference circuit generates a reference voltage between the first and the second power source potentials.

The first differential pair circuit has a first differential input terminal connected to the first amplifier output terminal, a first reference input terminal supplied with the reference voltage. The first differential pair circuit carries out half-wave rectification on the first amplified output voltage on the basis of the reference voltage to obtain a first half-wave rectified current. The first differential pair circuit has a first half-wave current output terminal for producing the first half-wave rectified current.

Likewise, the second differential pair circuit has a second differential input terminal connected to the second amplifier output terminal, a second reference input terminal supplied with the reference voltage. The second differential pair circuit carries out half-wave rectification on the second amplified output voltage on the basis of the reference voltage to obtain a second half-wave rectified current. The second differential pair circuit has a second half-wave current output terminal for producing the second half-wave rectified current.

The conventional full-wave rectifying circuit further comprises a current/voltage converting section having first and second half-wave current input terminals connected to the first and the second half-wave current output terminals, respectively. The current/voltage converting section combines the first and the second half-wave rectified currents into a full-wave rectified current and converts the full-wave rectified current into a full-wave rectified voltage. The current/voltage converting circuit has a full-wave voltage output terminal for producing the full-wave rectified voltage.

More specifically, the conventional current/voltage converting section comprises a current mirror circuit and an output resistor. The current mirror circuit is connected to the first power supply terminal and has first and second mirror input terminals as the first and the second half-wave current input terminals, respectively. The first and the second mirror input terminals of the current mirror circuit are supplied with the first and the second half-wave rectified currents as first and second mirror input currents. The current mirror circuit combines the first and the second mirror input currents into a mirror output current. The current mirror circuit has a mirror output terminal which is connected to the full-wave voltage output terminal and which produces the mirror output current as the full-wave rectified current. That is, the current mirror circuit serves as a combining arrangement for combining the first and the second half-wave rectified currents into the full-wave rectified current. The output resistor has an end connected to the full-wave voltage output terminal and another end connected to the second power supply terminal. The output resistor converts the mirror output current into the full-wave rectified voltage, thereby outputting the full-wave rectified voltage from the full-wave voltage output terminal.

As described above, the conventional full-wave rectifying circuit comprises the first and the second differential pair circuits. In addition, the conventional full-wave rectifying circuit comprises the current mirror circuit which acts as the combining arrangement for combining the first and the second half-wave rectified currents into the full-wave rectified current. As a result, the conventional full-wave rectifying circuit is disadvantageous in that it is complicated in structure and it is difficult to be implemented by a small-sized integrated circuit (IC).

Other full-wave rectifying circuits are already known. By way of example, a full-wave rectifying circuit is disclosed in Japanese Examined Patent Publication of Kokoku No. Shô 63-58,484, namely, 58,484/1988 having the title of invention "FULL-WAVE DETECTION CIRCUIT". The full-wave rectifying circuit according to Kokoku No. Shô 63-58,484 comprises a differential amplifier circuit, first through fourth current mirror circuits, a voltage reference source, first and second transistors. The differential amplifier circuit has an input terminal supplied with an input alternating current signal. The differential amplifier circuit differentially amplifies the input alternating current signal. The differential amplifier circuit has first and second amplifier output terminals for producing first and second amplified output currents, respectively, which are inverted in phase to each other.

The first current mirror circuit is located between the first amplifier output terminal and a positive power supply terminal supplied with a positive source voltage. The first current mirror circuit has a first mirror input terminal connected to the first amplifier output terminal. The first current mirror circuit has first mirror output terminals for producing first mirror output currents each of which has a current value equal to that of the first amplified output current. Likewise, the second current mirror circuit is located between the second amplifier output terminal and the positive power supply terminal. The second current mirror circuit has a second mirror input terminal connected to the second amplifier output terminal. The second current mirror circuit has second mirror output terminals for producing second mirror output currents each of which has a current value equal to that of the second amplified output current.

The third current mirror circuit is connected to an earth terminal supplied with a zero voltage and has a third mirror input terminal connected to one of the first mirror output terminals. The fourth current mirror circuit is connected to the earth terminal and has a fourth mirror input terminal connected to one of the second mirror output terminals. The third current mirror circuit has a third mirror output terminal connected to another of the second mirror output terminals while the fourth current mirror circuit has a fourth mirror output terminal connected to another of the first mirror output terminals. The third and the fourth mirror output terminals produce first and second single end output currents which are inverted in phase to each other.

The voltage reference source produces a predetermined bias current in the third and the fourth mirror output terminals to superimpose the first and the second single end output currents on the predetermined bias current. The first and the second transistors have first and second base electrodes connected to the third and the fourth mirror output terminals, respectively. The first and the second transistors have first and second collector electrodes which are connected to the positive power supply terminal in common. The first and the second transistors have first and second emitter electrodes which are connected to each other. A combination of the first and the second transistors serves as a combining arrangement for combining the first and the second single end output currents into a full-wave rectified signal. The first and the second emitter electrodes are connected to an end of an output resistor which has another end connected to an output terminal. The output terminal is connected to an end of a smoothing capacitor which has another end connected to the earth terminal. The full-wave rectified signal is produced by the output terminal.

Inasmuch as the full-wave rectifying circuit according to Kokoku No. Shô 63-58,484 comprises the first through the fourth current mirror circuits, it is complicated in structure and it is difficult to be implemented by a small-sized IC in the similar manner in the above-mentioned conventional full-wave rectifying circuit.

Another full-wave rectifying circuit is proposed in Japanese Unexamined Patent Prepublication of Kokai No. Hei 3-2,676, namely, 2,676/1991 having the title of invention "FULL-WAVE RECTIFYING CIRCUIT". The full-wave rectifying circuit according to Kokai No. Hei 3-2,676 comprises first and second differential pair circuits (differential couple circuits), a D.C. voltage source, and an emitter coupling circuit consisting of first and second output transistors. The first and second differential pair circuits are similar in structure to those of the above-mentioned conventional full-wave rectifying circuit. The D.C. voltage source acts as the voltage reference circuit for generating the reference voltage. In the manner which will later become clear, each of the first and second differential pair circuits has a pair of transistors which has emitter electrodes connected to each other.

The first output transistor has a first base electrode connected to the emitter electrodes of the first differential pair circuit while the second output transistor has a second base electrode connected to the emitter electrodes of the second differential pair circuit. The first and the second output transistors have first and second collector electrodes which are connected to a positive power supply terminal supplied with a positive source voltage. The first and the second output transistors have first and second emitter electrodes which are connected to an output terminal in common. The output terminal is connected to an earth terminal through a constant current source.

However, the full-wave rectifying circuit according to Kokai No. Hei 3-2,676 is defective in that it is complicated in structure and it is difficult to be implemented by a small-sized IC. This is because the full-wave rectifying circuit according to Kokai No. Hei 3-2,676 comprises the first and the second differential pair circuits in the similar manner in the above-mentioned conventional full-wave rectifying circuit.

SUMMARY OF THE INVENTION

It is therefore an object of this invention to provide a full-wave rectifying circuit which is simple in structure.

It is another object of this invention to provide a full-wave rectifying circuit of the type described, which is easily implemented by a small-sized integrated circuit (IC).

Other objects of this invention will become clear as the description proceeds.

On describing the gist of an aspect of this invention, it is possible to understand that a full-wave rectifying circuit has first and second power supply terminals supplied with first and second power source potentials, respectively. The first power source potential is higher than the second power source potential.

According to this invention, the above-understood full-wave rectifying circuit comprises a differential amplifier which has first and second amplifier input terminals supplied with an input alternating current signal therebetween. The differential amplifier differentially amplifies the input alternating current signal. The differential amplifier has first and second amplifier output terminals for producing first and second amplified output voltages, respectively, which are inverted in phase to each other. A voltage reference circuit generates a reference voltage between the first and the second power source potentials. A differential pair circuit has first and second differential input terminals connected to the first and the second amplifier output terminals, respectively, and has a reference input terminal supplied with the reference voltage. The differential pair circuit carries out half-wave rectification on the first and the second amplified output voltages on the basis of the reference voltage to obtain first and second half-wave rectified currents. The differential pair circuit includes a combining part for combining the first and the second half-wave rectified currents into a full-wave rectified current. The differential pair circuit has a full-wave current output terminal, connected to the combining part, for producing the full-wave rectified current.

Preferably, the above-understood full-wave rectifying circuit may further comprise a current/voltage converting section having a full-wave current input terminal connected to the full-wave current output terminal of the differential pair circuit. The current/voltage converting section converts the full-wave rectified current into a full-wave rectified voltage. The current/voltage converting section has a full-wave voltage output terminal for producing the full-wave rectified voltage.

BRIEF DESCRIPTION OF THE DRAWING

FIG. 2 is a circuit diagram of a full-wave rectifying circuit according to a preferred embodiment of the instant invention;

DESCRIPTION OF THE PREFERRED EMBODIMENT

Figure 1:
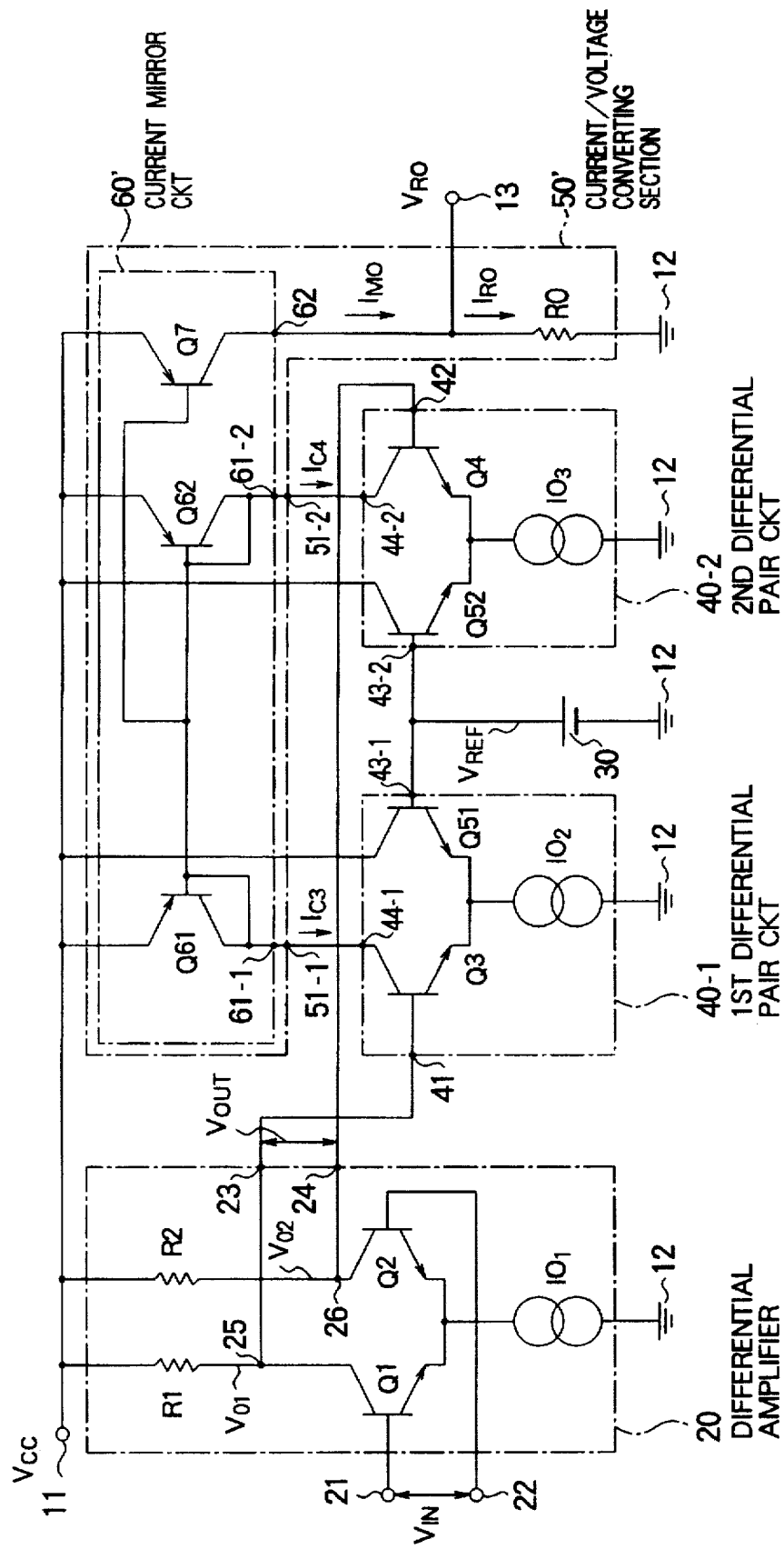
FIG. 1 is a circuit diagram of a conventional full-wave rectifying circuit.

Referring to FIG. 1, a conventional full-wave rectifying circuit will be described in order to facilitate an understanding of this invention. The full-wave rectifying circuit full-wave rectifies an input alternating current signal $V_{IN}$ such as a sinusoidal wave signal into a full-wave rectified signal.

The conventional full-wave rectifying circuit has first and second power supply terminals 11 and 12 supplied with first and second source potentials, respectively. The first power source potential is higher than the second power source potential. In the example being illustrated, the first power supply terminal 11 is a positive power supply terminal which is supplied with a positive power source voltage Vcc as the first power source potential while the second power supply terminal 12 is an earth or a ground terminal which is supplied with a zero voltage as the second power source potential. The full-wave rectifying circuit further has a full-wave voltage output terminal 13.

The illustrated full-wave rectifying circuit comprises a differential amplifier 20, a voltage reference circuit 30, first and second differential pair circuits 40-1 and 40-2, and a current/voltage converting section 50'. The differential pair circuit may be called a differential couple circuit. The differential amplifier 20 has first and second amplifier input terminals 21 and 22 supplied with the input alternating current signal $V_{IN}$ therebetween. The differential amplifier 20 differentially amplifies the input alternating current signal $V_{IN}$. The differential amplifier 20 has first and second amplifier output terminals 23 and 24 for producing first and second amplified output voltages $V_{O1}$ and $V_{O2}$, respectively.

The first and second amplified output voltages $V_{O1}$ and $V_{O2}$ have a difference output voltage $V_{OUT}$ therebetween. Namely, the difference output voltage $V_{OUT}$ is represented by:

$$V_{OUT} = V_{O1} - V_{O2}.$$

More specifically, the differential amplifier 20 comprises differentially operable first and second transistors Q1 and Q2, first and second resistors R1 and R2, and a first constant current source $IO_1$. The first and the second transistors Q1 and Q2 are connected to the first and the second amplifier input terminals 21 and 22. The first and the second transistors Q1 and Q2 have first and second nodes 25 and 26 connected to the first and the second amplifier output terminals 23 and 24, respectively. The first resistor R1 has an end connected to the first power supply terminal 11 and another end connected to the first node 25. The second resistor R2 has an end connected to the first power supply terminal 11 and another end connected to the second node 26. The first constant current source $IO_1$ is located between the first and the second transistors Q1 and Q2 and the second power supply terminal 12. In the full-wave rectifying circuit, each transistor is a bipolar transistor having base, collector, and emitter electrodes.

The first transistor Q1 is a first npn type bipolar transistor which has a first base electrode connected to the first amplifier input terminal 21, a first collector electrode as the first node 25, and a first emitter electrode connected to the first constant current source $IO_1$. The second transistor Q2 is a second npn type bipolar transistor which has a second base electrode connected to the second amplifier input terminal 22, a second collector electrode as the second node 26, and a second emitter electrode connected to the first constant current source $IO_1$.

The voltage reference circuit 30 generates a reference voltage $V_{REF}$ between the first and the second power source potentials.

The first differential pair circuit 40-1 has a first differential input terminal 41 connected to the first amplifier output terminal 23 and a first reference input terminal 43-1 supplied with the reference voltage $V_{REF}$. The first differential pair circuit 40-1 carries out half-wave rectification on the first amplified output voltage $V_{O1}$ on the basis of the reference voltage $V_{REF}$ to obtain a first half-wave rectified current $I_{C3}$. The first differential pair circuit 40-1 has a first half-wave current output terminal 44-1 for producing the first half-wave rectified current $I_{C3}$.

Likewise, the second differential pair circuit 40-2 has a second differential input terminal 42 connected to the second amplifier output terminal 24 and a second reference input terminal 43-2 supplied with the reference voltage $V_{REF}$. The second differential pair circuit 40-2 carries out half-wave rectification on the second amplified output voltage $V_{O2}$ on the basis of the reference voltage $V_{REF}$ to obtain a second half-wave rectified current $I_{C4}$. The second differential pair circuit 40-2 has a second half-wave current output terminal 44-2 for producing the second half-wave rectified current $I_{C4}$.

More specifically, the first differential pair circuit 40-1 comprises a pair of transistors Q3 and Q51 and a second constant current source $IO_2$. The transistor Q3 is connected to the first differential input terminal 41 and to the first half-wave current output terminal 44-1. The transistor Q51 is connected to the first reference input terminal 43-1 and to the first power supply terminal 11. The second constant current source $IO_2$ is located between the transistors Q3 and Q51 and the second power supply terminal 12. The transistor Q3 is an npn type bipolar transistor which has a base electrode connected to the first differential input terminal 41, a collector electrode connected to the first half-wave current output terminal 45-1, and an emitter electrode connected to the second constant current source $IO_2$. The transistor Q51 is an npn type bipolar transistor which has a base electrode connected to the first reference input terminal 43-1, a collector electrode connected to the first power supply terminal 11, and an emitter electrode connected to the second constant current source $IO_2$.

Similarly, the second differential pair circuit 40-2 comprises a pair of transistors Q4 and Q52 and a third constant current source $IO_3$. The transistor Q4 is connected to the second differential input terminal 42 and to the second half-wave current output terminal 44-2. The transistor Q52 is connected to the second reference input terminal 43-2 and to the first power supply terminal 11. The third constant current source $IO_3$ is located between the transistors Q4 and Q52 and the second power supply terminal 12. The transistor Q4 is an npn type bipolar transistor which has a base electrode connected to the second differential input terminal 42, a collector electrode connected to the second half-wave current output terminal 45-2, and an emitter electrode connected to the third constant current source $IO_3$. The transistor Q52 is an npn type bipolar transistor which has a base electrode connected to the second reference input terminal 43-2, a collector electrode connected to the first power supply terminal 11, and an emitter electrode connected to the third constant current source $IO_3$.

The current/voltage converting section 50' has first and second half-wave current input terminals 51-1 and 51-2 connected to the first and the second half-wave current output terminals 45-1 and 45-2, respectively. The current/voltage converting section 50' combines the first and the second half-wave rectified currents $I_{C3}$ and $I_{C4}$ into a full-wave rectified current $I_{RO}$ and converts the full-wave rectified current $I_{RO}$ into a full-wave rectified voltage $V_{RO}$. The current/voltage converting section 50' has the full-wave voltage output terminal 13 for producing the full-wave rectified voltage $V_{RO}$.

More specifically, the conventional current/voltage converting section 50' comprises a current mirror circuit 60' and an output resistor RO. The current mirror circuit 60 is connected to the first power supply terminal 11 and has first and second mirror input terminals 61-1 and 61-2 as the first and the second half-wave current input terminals 51-1 and 51-2, respectively. The first and the second mirror input terminals 61-1 and 61-2 of the current mirror circuit 60' are supplied with the first and the second half-wave rectified currents $I_{C3}$ and $I_{C4}$ as first and second mirror input currents. The current mirror circuit 60' combines the first and the second mirror input currents into a mirror output current $I_{MO}$. The current mirror circuit 60' has a mirror output terminal 62 which is connected to the full-wave voltage output terminal 13 and which produces the mirror output current $I_{MO}$ as the full-wave rectified current $I_{RO}$. That is, the current mirror circuit 60' serves as a combining arrangement for combining the first and the second half-wave rectified currents $I_{C3}$ and $I_{C4}$ into the full-wave rectified current $I_{RO}$. The output resistor RO has an end connected to the full-wave voltage output terminal 13 and another end connected to the second power supply terminal 12. The output resistor RO converts the mirror output current $I_{MO}$ into the full-wave rectified voltage $V_{RO}$, thereby outputting the full-wave rectified voltage $V_{RO}$ from the full-wave voltage output terminal 13.

The current mirror circuit 60' comprises three transistors Q61, Q62 and Q7. The transistor Q61 is connected to the first mirror input terminal 61-1 and the first power supply terminal 11. The transistor Q62 is connected to the second mirror input terminal 61-2 and the first power supply terminal 11. The transistor Q7 is connected to the first and the second mirror input terminals 61-1 and 61-2, the mirror output terminal 62, and the first power supply terminal 11. The transistor Q61 is a pnp type bipolar transistor which has a base electrode connected to the first mirror input terminal 61-1, a collector electrode connected to the first mirror input terminal 61-1, and an emitter electrode connected to the first power supply terminal 11. The transistor Q62 is a pnp type bipolar transistor which has a base electrode connected to the second mirror input terminal 61-2, a collector electrode connected to the second mirror input terminal 61-2, and an emitter electrode connected to the first power supply terminal 11. The transistor Q7 is a pnp type bipolar transistor which has a base electrode connected to the first and the second mirror input terminal 61-1 and 61-2, a collector electrode connected to the mirror output terminal 61, and an emitter electrode connected to the first power supply terminal 11.

However, the conventional full-wave rectifying circuit is disadvantageous in that it is complicated in structure and it is difficult to be implemented by a small-sized integrated circuit (IC), as mentioned in the preamble of the instant specification. This is because the conventional full-wave rectifying circuit comprises the first and the second differential pair circuit 40-1 and 40-2 and the current mirror circuit 60' which is operable as the combining arrangement for combining the first and the second half-wave rectified currents $I_{C3}$ and $I_{C4}$ into the full-wave rectified current $I_{RO}$.

Figure 2:
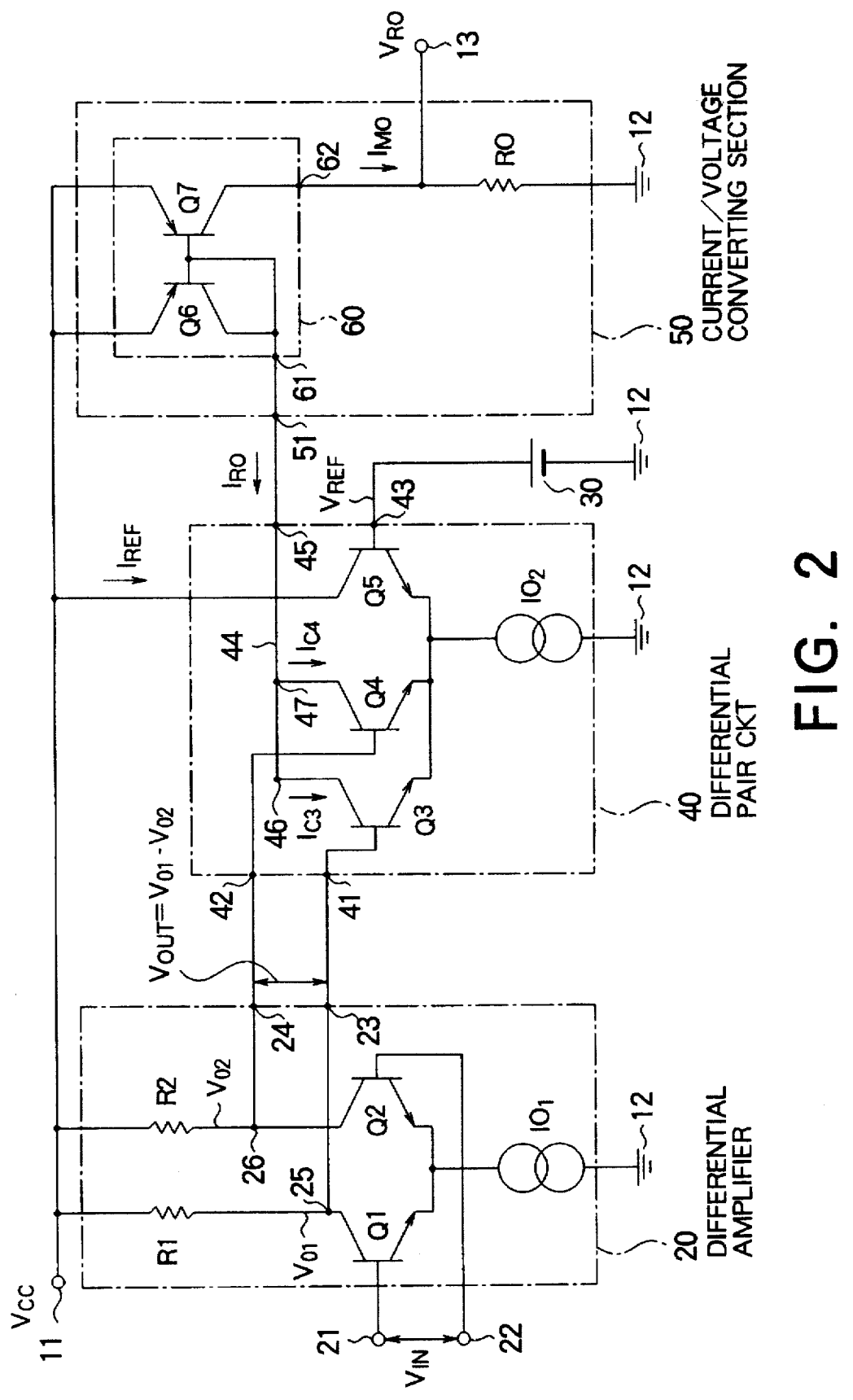

Referring to FIG. 2, a full-wave rectifying circuit according to a preferred embodiment of this invention is similar in structure to that illustrated in FIG. 1 except that the full-wave rectifying circuit comprises only one differential pair circuit 40 in place of the first and the second differential pair circuit 40-1 and 40-2 and the current/voltage converting section is modified to be different from that described in conjunction with FIG. 1 as will later become clear. The current/voltage converting section is therefore depicted at 50.

The differential pair circuit 40 has first and second differential input terminals 41 and 42 connected to the first and the second amplifier output terminals 23 and 24, respectively, and has a reference input terminal 43 supplied with the reference voltage $V_{REF}$. The differential pair circuit 40 carries out half-wave rectification on the first and the second amplified output voltages $V_{O1}$ and $V_{O2}$ on the basis of the reference voltage $V_{REF}$ to obtain first and second half-wave rectified currents $I_{C3}$ and $I_{C4}$. The differential pair circuit 40 includes a combining part 44 for combining the first and the second half-wave rectified currents $I_{C3}$ and $I_{C4}$ into a full-wave rectified current $I_{RO}$. The differential pair circuit 40 has a full-wave current output terminal 45 connected to the combining part 44. The full-wave current output terminal 45 produces the full-wave rectified current $I_{RO}$.

The differential pair circuit 40 comprises third through fifth transistors Q3, Q4, and Q5, and a second constant current source $IO_2$. The third and the fourth transistors Q3 and Q4 are connected to the first and the second differential input terminals 41 and 42 and has third and fourth nodes 46 and 47 connected to the full-wave current output terminal 45 via the combining part 44. The fifth transistor Q5 is connected to the reference input terminal 43 and to the first power supply terminal 11. The second constant current source $IO_2$ is located between the third through the fifth transistors Q3 to Q5 and the second power supply terminal 12.

More particularly, the third transistor Q3 is a third npn type bipolar transistor which has a third base electrode connected to the first differential input terminal 41, a third collector electrode as the third node 46, and a third emitter electrode connected to the second constant current source $IO_2$. The fourth transistor Q4 is a fourth npn type bipolar transistor which has a fourth base electrode connected to the second differential input terminal 42, a fourth collector electrode as the fourth node 47, and a fourth emitter electrode connected to the second constant current source $IO_2$. The combining part 44 is a connection line for connecting the third and the fourth collector electrodes with the full-wave current output terminal 45. The fifth transistor Q5 is a fifth npn type bipolar transistor which has a fifth base electrode connected to the reference input terminal 43, a fifth collector electrode connected to the first power supply terminal 11, and a fifth emitter electrode connected to the second constant current source $IO_2$.

The current/voltage converting section 50 has a full-wave current input terminal 51 connected to the full-wave current output terminal 45 of the differential pair circuit 40. The current/voltage converting section 50 converts the full-wave rectified current $I_{RO}$ into a full-wave rectified voltage $V_{RO}$. The current/voltage converting section 50 has the full-wave voltage output terminal 13 for producing the full-wave rectified voltage $V_{RO}$.

More specifically, the current/voltage converting section 50 comprises a current mirror circuit 60 and the output resistor RO. The current mirror circuit 60 is connected to the first power supply terminal 11. The current mirror circuit 60 has a mirror input terminal 61 as the full-wave current input terminal 51 and has the mirror output terminal 62 connected to the full-wave voltage output terminal 13. The mirror output terminal 62 produces a mirror output current $I_{MO}$. The mirror output current $I_{MO}$ has a current value which is equal to that of the full-wave rectified current $I_{RO}$. That is, the current mirror circuit 60 serves as a turning arrangement for turning the full-wave rectified current $I_{RO}$ into the mirror output current $I_{MO}$.

The current mirror circuit 60 comprises sixth and seventh transistors Q6 and Q7. The sixth transistor Q6 is connected to the mirror input terminal 61 and the first power supply terminal 11. The seventh transistor Q7 is connected to the mirror input terminal 61, the mirror output terminal 62, and the first power supply terminal 11. The sixth transistor Q6 is a first pnp type bipolar transistor which has a sixth base electrode connected to the mirror input terminal 61, a sixth collector electrode connected to the mirror input terminal 61, and a sixth emitter electrode connected to the first power supply terminal 11. The seventh transistor Q7 is a second pnp type bipolar transistor which has a seventh base electrode connected to the mirror input terminal 61, a seventh collector electrode connected to the mirror output terminal 62, and a seventh emitter electrode connected to the first power supply terminal 11.

With this structure, in the differential pair circuit 40, a pair of the third and the fifth transistors Q3 and Q5 is for use in carrying out half-wave rectification on the first amplified output voltage $V_{O1}$ on the basis of the reference voltage $V_{REF}$ to obtain the first half-wave rectified current $I_{C3}$ while another pair of the fourth and the fifth transistors Q3 and Q5 is for use in carrying out half-wave rectification on the second amplified output voltage $V_{O2}$ on the basis of the reference voltage $V_{REF}$ to obtain the second half-wave rectified current $I_{C4}$.

Figure 3:
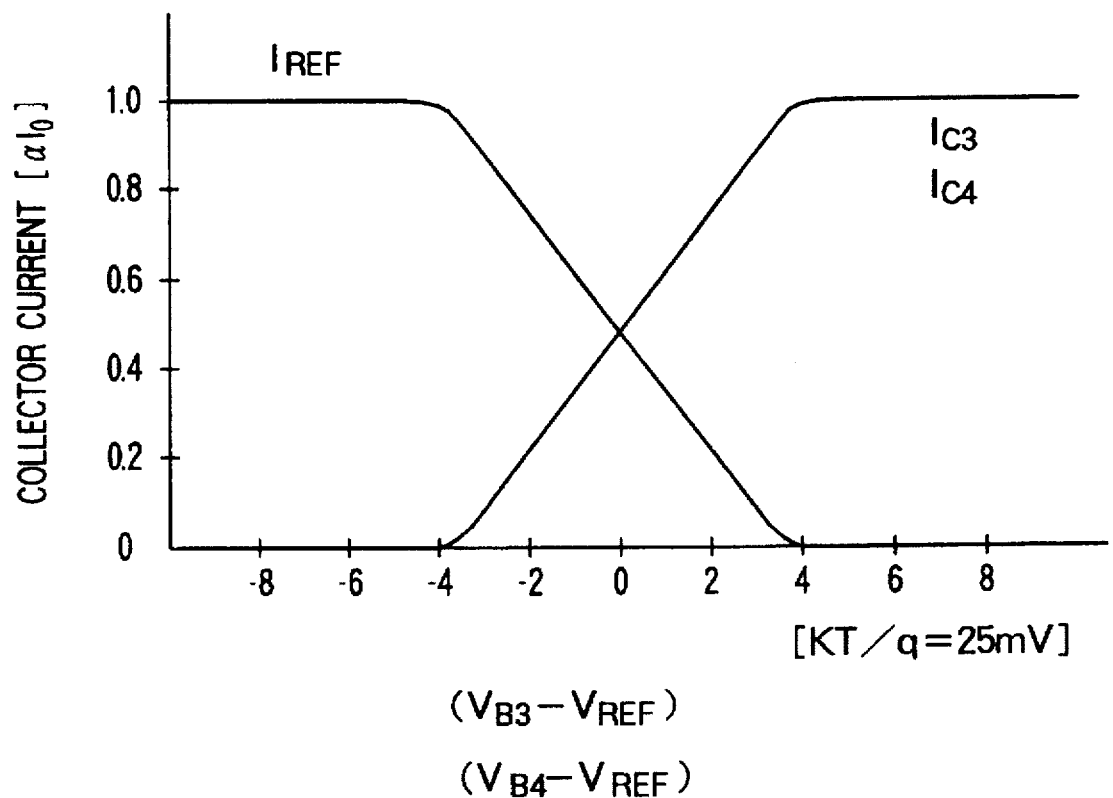
FIG. 3 shows characteristics of collector currents in a differential pair circuit for use in the full-wave rectifying circuit illustrated in FIG. 2.

Referring now to FIG. 3 in addition to FIG. 2, the description will proceed to an operation in a case where an offset voltage is applied to an input bias voltage of the differential pair circuit 40 (namely, base voltages of the third and the fourth transistors Q3 and Q4) and the reference voltage $V_{REF}$ (namely, a base voltage of the fifth transistor Q5). It is presumed that the third transistor Q3 has a third base voltage $V_{B3}$ and a third collector current $I_{C3}$ as the first half-wave rectified current, the fourth transistor Q4 has a fourth base voltage $V_{B4}$ and a fourth collector current $I_{C4}$ as the second half-wave rectified current), and the fifth transistor Q5 has a fifth base voltage as the reference voltage $V_{REF}$ and a fifth collector current as a reference current $I_{REF}$. Under the circumstances, the third collector current (the first half-wave rectified current) $I_{C3}$ for the third base voltage $V_{B3}$ and the fifth base voltage (the reference voltage) $V_{REF}$, the fifth collector current (the reference current) $I_{REF}$ for the third base voltage $V_{B3}$ and the fifth base voltage (the reference voltage) $V_{REF}$, the fourth collector current (the second half-wave rectified current) $I_{C4}$ for the fourth base voltage $V_{B4}$ and the fifth base voltage (the reference voltage) $V_{REF}$, and the fifth collector current (the reference current) $I_{REF}$ for the fourth base voltage $V_{B4}$ and the fifth base voltage (the reference voltage) $V_{REF}$ are represented by following equations (1), (2), (3), and (4):

$$I_{C3} = \frac{\alpha I_o}{1 + \exp\frac{-q(V_{B3} - V_{REF})}{KT}} \quad (1)$$

$$I_{REF} = \frac{\alpha I_o}{1 + \exp\frac{q(V_{B3} - V_{REF})}{KT}} \quad (2)$$

$$I_{C4} = \frac{\alpha I_o}{1 + \exp\frac{-q(V_{B4} - V_{REF})}{KT}} \quad (3)$$

$$I_{REF} = \frac{\alpha I_o}{1 + \exp\frac{q(V_{B4} - V_{REF})}{KT}} \quad (4)$$

where $I_o$ represents a constant current, $\alpha$ represents a current amplification factor (which is the ratio of electrons reaching the collector electrode to electrons emitted from the emitter electrode, $\alpha=1$), q represents a capacitance of an electric charge, K represents Boltzmann's constant, and T represents absolute temperature.

FIG. 3 shows characteristics of the third collector current (the first half-wave rectified current) $I_{C3}$, of the fourth collector current (the second half-wave rectified current) $I_{C4}$, and of the the fifth collector current (the reference current) $I_{REF}$. In FIG. 3, the abscissa represents difference voltages $(V_{B3}-V_{REF})$ and $(V_{B4}-V_{REF})$ in unit of (KT/q=25 mV) and the ordinate represents the collector current in unit of ($\alpha I_o$).

As apparent from FIG. 3, when absolute values of the difference voltages $(V_{B3}-V_{REF})$ or $(V_{B4}-V_{REF})$, namely, $|V_{B3}-V_{REF}|$ or $|V_{B4}-V_{REF}|$ are equal to a voltage of 4 KT/q or 100 mV or more, the third through the fifth collector currents $I_{C3}$, $I_{C4}$, and $I_{REF}$ are nearly equal to either zero or $\alpha I_o$. That is, in the full-wave rectifying circuit illustrated in FIG. 2, when the first and the second amplifier output voltages $V_{O1}$ and $V_{O2}$ are supplied to the third and the fourth base electrodes of the third and the fourth transistors Q3 and Q4 with the reference voltage $V_{REF}$ (the fifth base voltage of the fifth transistor Q5) held to a base offset voltage higher than the third and the fourth base voltages $V_{B3}$ and $V_{B4}$, which is determined by an output bias voltage of the differential amplifier 20, by the voltage of 4 KT/q, the third and the fourth transistors Q3 and Q4 have the third and the fourth collector current IC3 and IC4 obtained by half-wave rectifying the first and the second amplifier output voltages $V_{O1}$ and $V_{O2}$, respectively. By connecting the third collector of the third transistor Q3 with the fourth collector of the fourth transistor Q4 by the connection line 44, the full-wave rectified current $I_{RO}$ for the input alternating current signal $V_{IN}$ is obtained.

Figure 4:
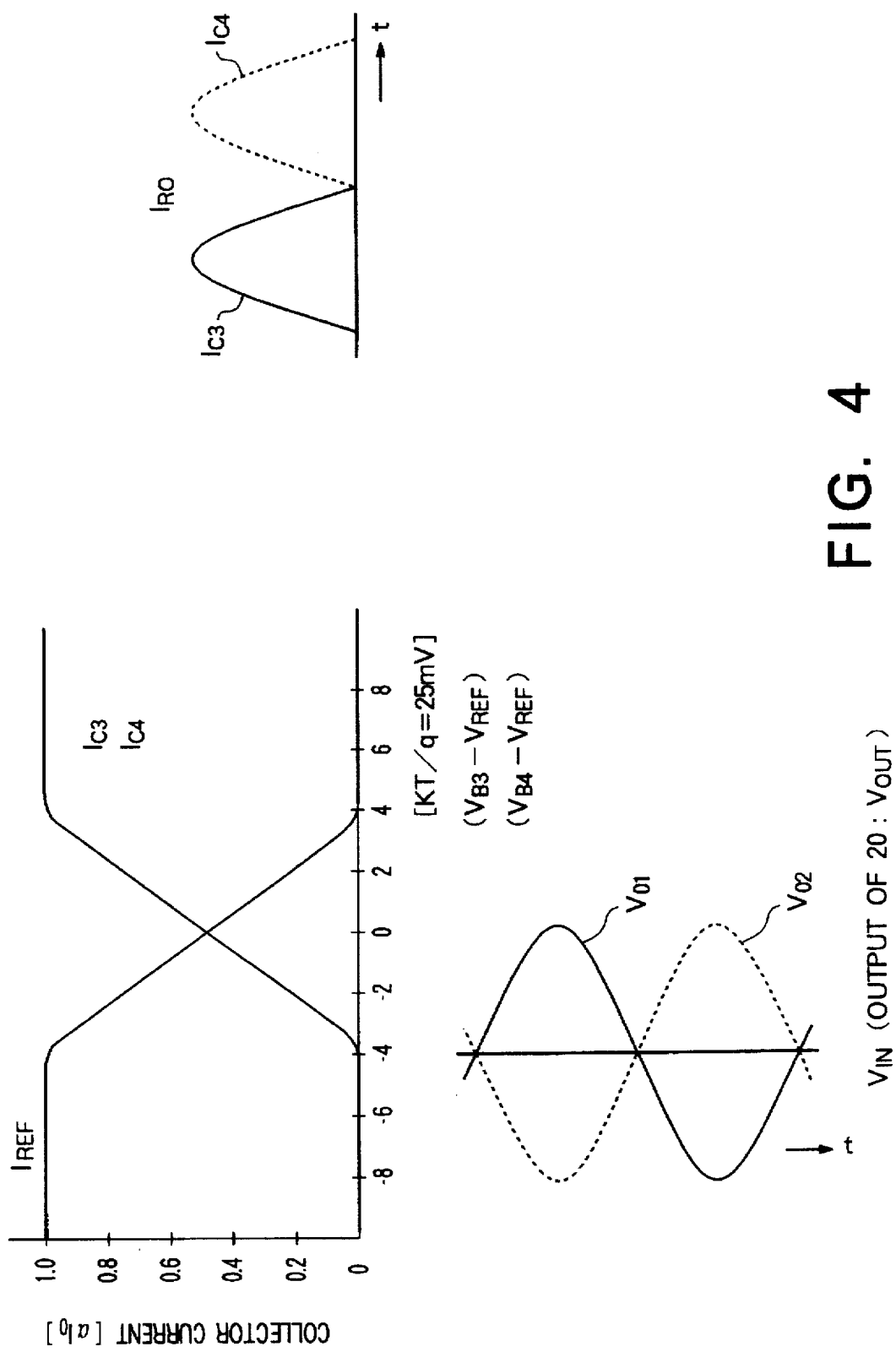
FIG. 4 shows an input/output characteristics of an input alternating current signal versus a full-wave rectified current in the the full-wave rectifying circuit illustrated in FIG. 2.

FIG. 4 shows an input/output characteristic of the input alternating current signal $V_{IN}$ versus the full-wave rectified current $I_{RO}$.

Figure 5:
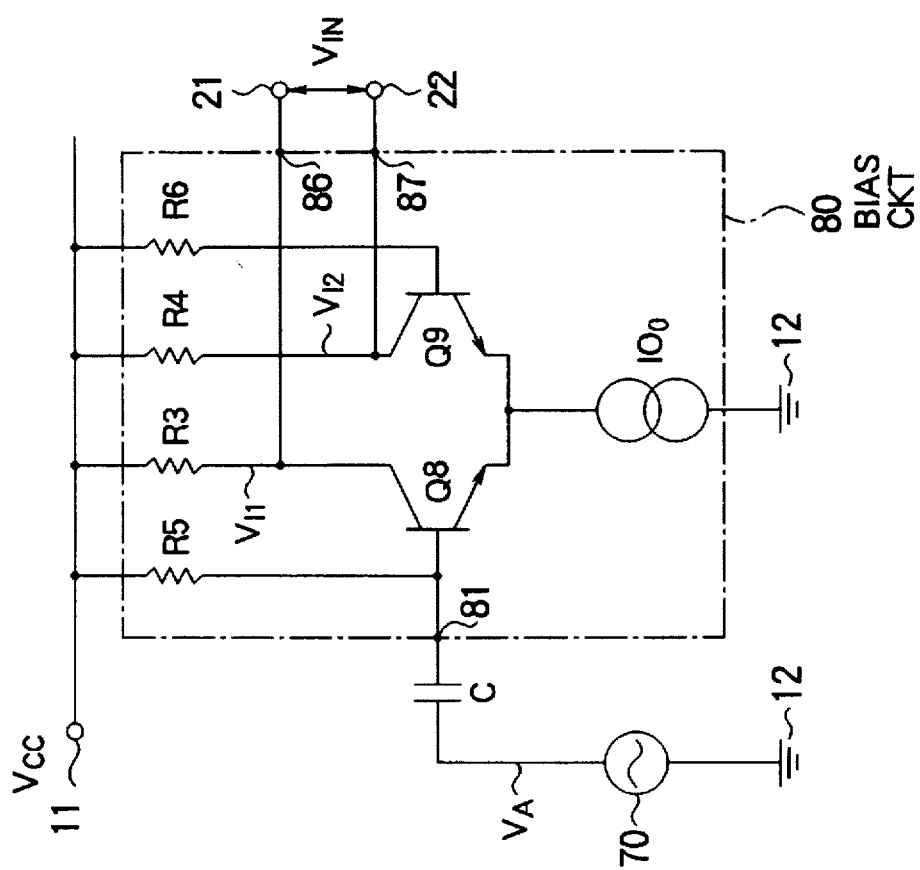
FIG. 5 is a circuit diagram of a bias circuit together with a signal source for use in combination with the full-wave rectifying circuit illustrated in FIG. 2.

Turning to FIG. 5, the input alternating current signal $V_{IN}$ is produced by a combination of a signal source 70 and a bias circuit 80. The signal source 70 is connected to the second power supply terminal 12 and generates an original alternating current signal $V_A$. The bias circuit 80 has a bias input terminal 81 connected to the signal source 70 through a coupling capacitor C. The bias circuit 80 generates a bias voltage in the manner which will later become clear. The bias circuit 80 superimposes the original alternating current signal $V_A$ on the bias voltage to obtain the input alternating current signal $V_{IN}$. The bias circuit 80 has first and second bias output terminals 86 and 87 for producing the input alternating current signal $V_{IN}$ therebetween. The first and second bias output terminals 86 and 87 are connected to the first and the second amplifier input terminals 21 and 22 of the differential amplifier 20, respectively. The first and second bias output terminals 86 and 87 produce first and second biased output voltages $V_{f1}$ and $V_{f2}$, respectively. The first and second biased output voltages $V_{f1}$ and $V_{f2}$ have the input alternating current signal $V_{IN}$ therebetween. That is, the input alternating current signal $V_{IN}$ is represented by as follows:

$$V_{IN} = V_{f1} - V_{f2}.$$

More specifically, the bias circuit 80 comprises a pair of npn type bipolar transistors Q8 and Q9, four resistors R3, R4, R5, and R6, and a constant current source $IO_0$. The transistor Q8 has a base electrode connected to the bias input terminal 81, a collector electrode connected to the first bias output terminal 82, and an emitter electrode connected to the constant current source $IO_0$. The transistor Q9 has a collector electrode connected to the second bias output terminal 87 and an emitter electrode connected to the constant current source $IO_0$. The resistor R3 has an end connected to the collector electrode of the transistor Q8 and another end connected to the first power supply terminal 11. The resistor R4 has an end connected to the collector electrode of the transistor Q8 and another end connected to the first power supply terminal 11. The resistor R5 has an end connected to the base electrode of the transistor Q8 and another end connected to the first power supply terminal 11. The resistor R6 has an end connected to a base electrode of the transistor Q9 and another end connected to the first power supply terminal 11. The constant current source $IO_0$ is located between the emitter electrodes of the transistors Q8 and Q9 and the second power supply terminal 12.

It is assumed that each of the resistors R3 and R4 has a resistance of $R_0$ and the constant current source $IO_0$ flows a constant current of $I_0$. In this event, the bias voltage is equal to $(V_{cc} - R_0 \cdot I_0/2)$.

Figure 6:
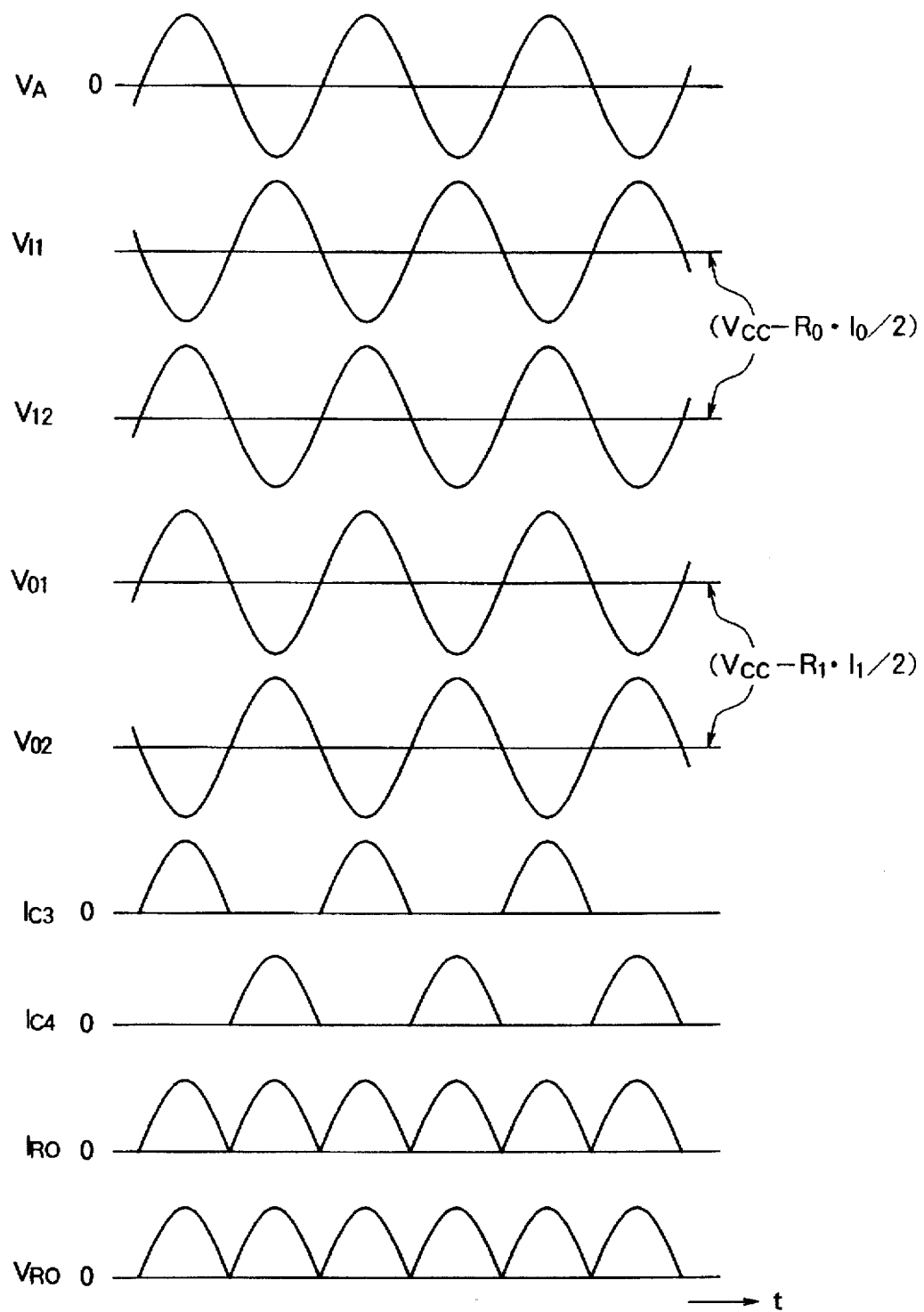
FIG. 6 is a time chart for use in describing operation of the full-wave rectifying circuit illustrated in FIG. 2.

Referring to FIG. 6 in addition to FIGS. 2 and 5, an operation of the full-wave rectifying circuit illustrated in FIG. 2 will be described below. The original alternating current signal $V_A$ is depicted along a first or top line in FIG. 6. The first and second biased output voltages $V_{f1}$ and $V_{f2}$ are depicted along second and third lines from the top, respectively. The first and the second amplified output voltages VO1 and VO2 are depicted along fourth and fifth lines from the top, respectively. The first and the second half-wave rectified currents IC3 and IC4 are depicted along sixth and seventh lines from the top. The full-wave rectified current $I_{RO}$ is depicted along an eighth line from the top. The full-wave rectified voltage $V_{RO}$ is depicted along a ninth or bottom line in FIG. 6.

The signal source 70 generates the original alternating current signal $V_A$ in the manner depicted along the top line. The bias circuit 80 produces the first and the second biased output voltages $V_{f1}$ and $V_{f2}$ which have opposite phase and in phase with the original alternating current signal $V_A$ in the manner depicted along the second and the third lines, respectively. Each of the first and the second biased output voltages $V_{f1}$ and $V_{f2}$ has the bias voltage is equal to $(V_{cc} - R_0 \cdot I_0/2)$. The differential amplifier 20 produces the first and the amplified output voltages $V_{O1}$ and $V_{O2}$ which have opposite phase with the first and the second biased output voltages $V_{f1}$ and $V_{f2}$ in the manner depicted along the fourth and the fifth lines, respectively. Each of the first and the amplified output voltages $V_{O1}$ and $V_{O2}$ has an output bias voltage. It is presumed that each of the first and the second resistors R1 and R2 has a resistance of $R_1$ and the first constant current source $IO_1$ flows a constant current of $I_1$. In this event, the output bias voltage is equal to $(V_{cc} - R_1 \cdot I_1/2)$.

In the differential pair circuit 40, the first and the second half-wave rectified currents $I_{C3}$ and $I_{C4}$ flow on the basis of the reference voltage $V_{REF}$ in the manner depicted along the sixth and the seventh lines. The differential pair circuit 40 produces the full-wave rectified current $I_{RO}$ by combining the first half-wave rectified current $I_{C3}$ with the second half-wave rectified current $I_{C4}$ in the manner depicted along the eighth line. The output resistor RO in the current/voltage converting section 50 converts the full-wave rectified current $I_{RO}$ into the full-wave rectified voltage $V_{RO}$ in the manner depicted along the bottom line.

While this invention has thus far been described in specific conjunction with a preferred embodiment thereof, it will now be readily possible for those skilled in the art to carry this invention into effect in various other manners. For example, the transistors composing of the full-wave rectifying circuit may be field effect transistors each of which has gate, drain, and source electrodes.

What is claimed is:

1. A full-wave rectifying circuit having first and second power supply terminals supplied with first and second power source potentials, respectively, the first power source potential being higher than the second power source potential, said full-wave rectifying circuit comprising:

a differential amplifier, having first and second amplifier input terminals supplied with an input alternating current signal therebetween, for differentially amplifying the input alternating current signal, said differential amplifier having first and second amplifier output terminals for producing first and second amplified output voltages, respectively, which are inverted in phase to each other;

a voltage reference circuit for generating a reference voltage between the first and the second power source potentials; and a differential pair circuit, having first and second differential input terminals connected to the first and the second amplifier output terminals, respectively, and having a reference input terminal supplied with the reference voltage, for carrying out half-wave rectification on the first and the second amplified output voltages on the basis of the reference voltage to obtain first and second half-wave rectified currents, said differential pair circuit including a combining part for combining the first and the second half-wave rectified currents into a full-wave rectified current, said differential pair circuit having a full-wave current output terminal, connected to the combining part, for producing the full-wave rectified current.

2. A full-wave rectifying circuit as claimed in claim 1, wherein said differential amplifier comprises differentially operable first and second transistors connected to the first and the second amplifier input terminals and having first and second nodes connected to the first and the second amplifier output terminals, respectively, first and second resistors between the first power supply terminal and the first and the second nodes, and a first constant current source between said first and said second transistors and said second power supply terminal.

3. A full-wave rectifying circuit as claimed in claim 2, wherein said first transistor is a first npn type bipolar transistor having a first base electrode connected to the first amplifier input terminal, a first collector electrode as the first node, and a first emitter electrode connected to said first constant current source, said second transistor being a second npn type bipolar transistor having a second base electrode connected to the second amplifier input terminal, a second collector electrode as the second node, and a second emitter electrode connected to said first constant current source.

4. A full-wave rectifying circuit as claimed in claim 2, wherein said differential pair circuit comprises third and fourth transistors connected to the first and the second differential input terminals and having third and fourth nodes connected to the full-wave current output terminal via the combining part, a fifth transistor connected to the reference input terminal and to the first power supply terminal, and a second constant current source between said third through said fifth transistors and said second power supply terminal.

5. A full-wave rectifying circuit as claimed in claim 4, wherein said third transistor is a third npn type bipolar transistor having a third base electrode connected to the first differential input terminal, a third collector electrode as the third node, and a third emitter electrode connected to said second constant current source, said fourth transistor being a fourth npn type bipolar transistor having a fourth base electrode connected to the second differential input terminal, a fourth collector electrode as the fourth node, and a fourth emitter electrode connected to said second constant current source, the combining part being a connection line for connecting the third and the fourth collector electrodes with the full-wave current output terminal, said fifth transistor being a fifth npn type bipolar transistor having a fifth base electrode connected to the reference input terminal, a fifth collector electrode connected to the first power supply terminal, and a fifth emitter electrode connected to said second constant current source.

6. A full-wave rectifying circuit as claimed in claim 4, further comprising a current/voltage converting section having a full-wave current input terminal connected to the full-wave current output terminal of said differential pair circuit, said current/voltage converting section converting the full-wave rectified current into a full-wave rectified voltage, said current/voltage converting section having a full-wave voltage output terminal for producing the full-wave rectified voltage.

7. A full-wave rectifying circuit as claimed in claim 6, wherein said current/voltage converting section comprises a current mirror circuit, connected to the first power supply terminal and having a mirror input terminal as the full-wave current input terminal and having a mirror output terminal connected to the full-wave voltage output terminal, the mirror output terminal producing a mirror output current which has a current value equal to that of the full-wave rectified current, and an output resistor having an end connected to the full-wave voltage output terminal and another end connected to the second power supply terminal, said output resistor converting the mirror output current into the full-wave rectified voltage, thereby outputting the full-wave rectified voltage from the full-wave voltage output terminal.

8. A full-wave rectifying circuit as claimed in claim 7, wherein said current mirror circuit comprises a sixth transistor connected to the mirror input terminal and the first power supply terminal and a seventh transistor connected to the mirror input terminal, the mirror output terminal, and the first power supply terminal.

9. A full-wave rectifying circuit as claimed in claim 8, wherein said sixth transistor is a first pnp type bipolar transistor having a sixth base electrode connected to the mirror input terminal, a sixth collector electrode connected to the mirror input terminal, and a sixth emitter electrode connected to the first power supply terminal, said seventh transistor being a second pnp type bipolar transistor having a seventh base electrode connected to the mirror input terminal, a seventh collector electrode connected to the mirror output terminal, and a seventh emitter electrode connected to the first power supply terminal.

* * * * *